(12) United States Patent
Alptekin et al.

(10) Patent No.: US 9,305,835 B2
(45) Date of Patent: Apr. 5, 2016

(54) FORMATION OF AIR-GAP SPACER IN TRANSISTOR

(71) Applicant: International Business Machines Corporation, Armonk, NY (US)

(72) Inventors: Emre Alptekin, Wappingers Falls, NY (US); Viraj Sardesai, Poughkeepsie, NY (US); Cung Tran, Newburgh, NY (US); Reinaldo Vega, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 26 days.

(21) Appl. No.: 14/190,641

(22) Filed: Feb. 26, 2014

(65) Prior Publication Data

US 2015/0243544 A1 Aug. 27, 2015

(51) Int. Cl.
*H01L 21/76* (2006.01)
*H01L 21/4763* (2006.01)
*H01L 21/70* (2006.01)
*H01L 21/768* (2006.01)
*H01L 21/28* (2006.01)
*H01L 21/283* (2006.01)

(52) U.S. Cl.
CPC .......... *H01L 21/7682* (2013.01); *H01L 21/283* (2013.01); *H01L 21/28008* (2013.01); *H01L 21/76877* (2013.01)

(58) Field of Classification Search
None
See application file for complete search history.

(56) References Cited

U.S. PATENT DOCUMENTS

| 6,596,598 | B1 | 7/2003 | Krivokapic et al. | |
|---|---|---|---|---|
| 7,253,094 | B1* | 8/2007 | Zhang et al. | 438/618 |
| 7,566,656 | B2 | 7/2009 | Liu et al. | |
| 7,741,663 | B2 | 6/2010 | Hause et al. | |
| 7,811,924 | B2 | 10/2010 | Cui et al. | |
| 8,030,202 | B1* | 10/2011 | Horak et al. | 438/619 |
| 8,048,796 | B2 | 11/2011 | Seidel et al. | |
| 8,421,166 | B2 | 4/2013 | Chi et al. | |
| 2004/0079726 | A1* | 4/2004 | Tabery et al. | 216/58 |
| 2011/0237075 | A1 | 9/2011 | Nitta et al. | |
| 2012/0104512 | A1* | 5/2012 | Horak | H01L 29/4983 257/401 |
| 2013/0049132 | A1* | 2/2013 | Doris et al. | 257/383 |

FOREIGN PATENT DOCUMENTS

KR 100672823 B1 1/2007

* cited by examiner

*Primary Examiner* — Calvin Choi
*Assistant Examiner* — Xiaoming Liu
(74) *Attorney, Agent, or Firm* — Steven J. Meyers; Hoffman Warnick LLC

(57) ABSTRACT

Embodiments of present invention provide a method of forming air spacers in a transistor structure. The method includes forming a gate structure of a transistor on top of a semiconductor substrate; forming a first and a second disposable spacers adjacent to a first and a second sidewall of the gate structure; forming a first and a second conductive studs next to the first and the second disposable spacer; removing the first and second disposable spacers to create empty spaces between the first and second conductive studs and the gate structure; and preserving the empty spaces by forming dielectric plugs at a top of the empty spaces.

20 Claims, 12 Drawing Sheets

FORMATION OF AIR-GAP SPACER IN TRANSISTOR

FIELD OF THE INVENTION

The present invention relates generally to the field of semiconductor device manufacturing and in particular relates to method of forming air-gap spacers in a transistor structure to reduce parasitic capacitance between gate and source/drain contact.

BACKGROUND

As semiconductor device manufacturing technology continues to evolve toward the direction of enabling further shrinkage of footprint and/or size of devices that it manufactures, semiconductor devices such as, for example, transistors are becoming smaller than ever before in overall structural size. Consequently, in the meantime, structure related parasitic characteristics of these smaller devices are becoming increasingly important in influencing and sometimes determining application of these devices. For example, capacitance that may be found in the form of gate-to-source or gate-to-drain has come to play an ever bigger role of impacting operational speed of a transistor, energy consumption of any integrated circuit (IC) that makes use of that transistor, and other aspects of performance. In general, gate-to-source or gate-to-drain capacitance is affected, and determined, by the size of gate and source/drain contact as well as characteristic of the dielectric material, represented typically by its dielectric constant, between the gate and the source/drain contact. For example, in a conventional field-effect-transistor (FET), the dielectric material may include, among others, spacers at the sidewalls of the gate.

SUMMARY OF EMBODIMENTS OF THE INVENTION

Embodiments of present invention provide a method of forming air-gap spacers in connection with the formation of a transistor. Compared with a conventional transistor that has either oxide spacers or nitride spacers at the sidewalls of gate, the use of air-gap spacers reduces gate to source or gate to drain contact capacitance of the transistor by virtue of a lower dielectric constant of the air (in the air-gap spacers), in comparison with that of oxide or nitride spacers. This reduction in capacitance results in significantly increase or improvement in both operational speed and reduction in energy consumption by the transistor. In the meantime, the process of forming air gap spacers also helps reduce the chance of causing electric short between gate and source/drain contact, thereby improving overall yield of the devices under manufacturing.

More specifically, embodiments of present invention include using carbon material to initially form disposable carbon spacers which are later removed, at subsequent manufacturing process steps, to create air-gap spacers therein. For example, disposable carbon spacers may be formed and removed in connection with the formation of trench silicide. More specifically, as in one embodiment, trench silicide may be formed, during a process of manufacturing the transistors, which is then followed by the formation of disposable carbon spacers next thereto. Next, a trench silicide liner may be applied to the carbon spacers and tungsten (W) may be deposited in the remaining openings in the trench. The deposited tungsten (W) may be polished to finish creating source/drain contact. After the formation of tungsten contact, the disposable carbon spacers may be removed through an ash process in an oxygen environment. By removing the carbon spacers, the ash process thus creates air gaps between tungsten contact and the gate of the transistor. Next, the top of the air gaps may be sealed by a thin layer of insulating material which is sputter deposited onto the device. Once the air gaps are sealed to become air-gap spacers, subsequent steps of manufacturing the transistors may continue.

According to one embodiment of present invention, a method is provided that includes forming a transistor having a gate structure on top of a semiconductor substrate; forming at least one disposable spacer adjacent to a sidewall of the gate structure; forming at least one conductive stud next to the disposable spacer, the conductive stud being on top of and contacting a source/drain region of the transistor; removing the disposable spacer to create an empty space between the conductive stud and the gate structure; and sealing the empty space to form an air spacer between the conductive stud and the gate structure of the transistor.

In one embodiment, forming the disposable spacer includes depositing a carbon layer covering the gate structure of the transistor, and subsequently applying a directional etching process in removing horizontal portions of the carbon layer, leaving only a vertical portion of the carbon layer, that is adjacent to the sidewall of the gate structure, to form the disposable spacer.

In another embodiment, removing the disposable spacer includes subjecting the disposable spacer to an oxygen plasma environment; causing the disposable spacer to react with one or more species of the oxygen plasma to form a volatile product; and pumping the volatile product away from the gate structure of the transistor.

In yet another embodiment, sealing the empty space comprises depositing a layer of dielectric material to fill in the empty space in a depth less than a height of the empty space.

In one embodiment, the method further includes depositing a liner lining the disposable spacer and the source/drain region before forming the conductive stud, wherein the source/drain region having a silicide on top thereof. In yet another embodiment, the gate structure includes a gate and at least one sidewall spacer, wherein the disposable spacer is formed next to the sidewall spacer of the gate structure.

One embodiment of present invention provides a method including providing a semiconductor substrate; forming a first and a second gate structure of a first and a second transistor on the substrate; forming a first and a second disposable spacer adjacent to sidewalls of the first and second gate structures respectively, the first and second disposable spacers facing each other and being between the first and second gate structures; forming a conductive stud between the first and second disposable spacers, the conductive stud contacting a source/drain region of the first and second transistors; creating a first empty space between the conductive stud and the first gate structure and a second empty space between the conductive stud and the second gate structure; and sealing the first and second empty spaces to form a first and a second air spacer between the conductive stud and the first and second gate structures of the first and second transistors.

Another embodiment of present invention provides a method including forming a gate structure of a transistor on top of a semiconductor substrate; forming a first and a second disposable spacers adjacent respectively to a first and a second sidewall of the gate structure; forming a first and a second conductive studs next respectively to the first and the second disposable spacer; removing the first and second disposable spacers to create empty spaces between the first and second conductive studs and the gate structure; and preserving the empty spaces by forming dielectric plugs at a top of the empty spaces.

BRIEF DESCRIPTION OF THE DRAWINGS

The present invention will be understood and appreciated more fully from the following detailed description of preferred embodiments, taken in conjunction with the accompanying drawings of which.

Figure 1:
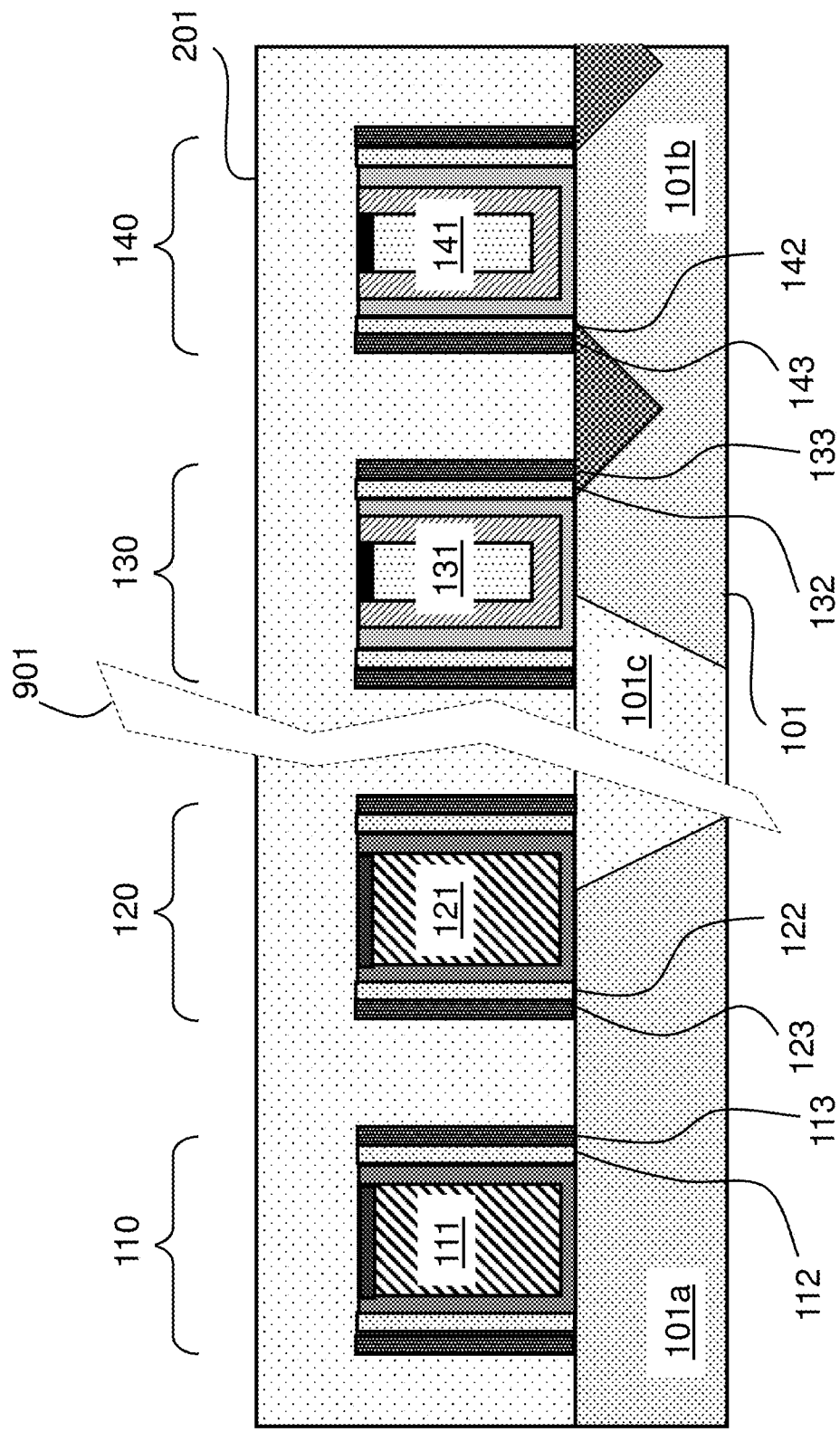
FIG. 1 is a demonstrative illustration of a step of a method of forming air-gap spacers in contact areas of transistors according to one embodiment of present invention.

It will be appreciated that for purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF EMBODIMENTS OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the invention.

FIG. 1 is a demonstrative illustration of a step of a method of forming air-gap spacers in contact areas of transistors according to one embodiment of present invention. For example, it is illustrated in FIG. 1 that one or more transistors or transistor structures such as, for example, transistor structures 110, 120, 130, and 140 may be formed on top of a common substrate 101. The one or more transistor structures may be n-type transistors such as transistor 110 and 120 formed in a n-type doped region or area 101a of substrate 101, or may be p-type transistors such as transistor 130 and 140 formed in a p-type doped region or area 101b of substrate 101. In some embodiments, one or more of the transistor structures may be dummy transistor structures that may be formed around and/or used to merely form separation between a first group of transistors such as an n-type group of transistors and a second group of transistors such as a p-type group of transistors. In FIG. 1, the separation between a first group and a second group of transistors is demonstratively illustrated by symbol or element 901. For example, in FIG. 1, the n-type doped area 101a and p-type doped area 101b of substrate 101 may be separated and/or isolated from each other by an isolation region such as, for example, a shallow-trench-insulation (STI) region 101c formed inside substrate 101 between region 101a and region 101b.

According to one embodiment, transistors 110, 120, 130, and 140 may be formed to have their respective gate structures 111, 121, 131, and 141, and one or more sets of spacers formed at sidewalls of these gate structures. For example, n-type transistor 110 may have a first set of spacers 112 being formed at two opposing sidewalls of gate structure 111. Optionally, transistor 110 may have one or more additional sets of spacers such as a second set of spacers 113 formed next to the first set of spacers 112 and so indirectly next to sidewalls of gate structure 111. Similarly, n-type transistor 120 may have a first set and, optionally, a second set of spacers 122 and 123 next to two opposing sidewalls of gate structure 121. Generally, gate structures 111 and 121 may have more or less sets of spacers.

Similarly, p-type transistor 130 may have one or more sets of spacers, such as spacers 132 and 133, formed next to sidewalls of gate structure 131; and p-type transistor 140 may have one or more sets of spacers, such as spacers 142 and 143, formed next to sidewalls of gate structure 141. Moreover, gate structures 111, 121, 131, and 141 may be metal gate and may be formed either in a gate-first process or in a gate-last process as is commonly known in the art. In a gate-last process, gate structures 111, 121, 131, and 141 may be formed through a replacement-metal-gate process. In FIG. 1, gate structures 111, 121, 131, and 141 are demonstratively illustrated to have different layer or layers of work-function metals, and are formed to have different combination of metal elements. In addition, n-type transistors 110 and 120 are illustrated to possibly have different source/drain regions, doped or un-doped, from that of p-type transistors 130 and 140. However, embodiments of present invention are not limited in this aspect, and may be applied to other types of transistors, and/or gate structures, and/or source/drain regions. Gate structures 111, 121, 131, and 141 are covered or embedded in a dielectric layer 201.

Figure 2:
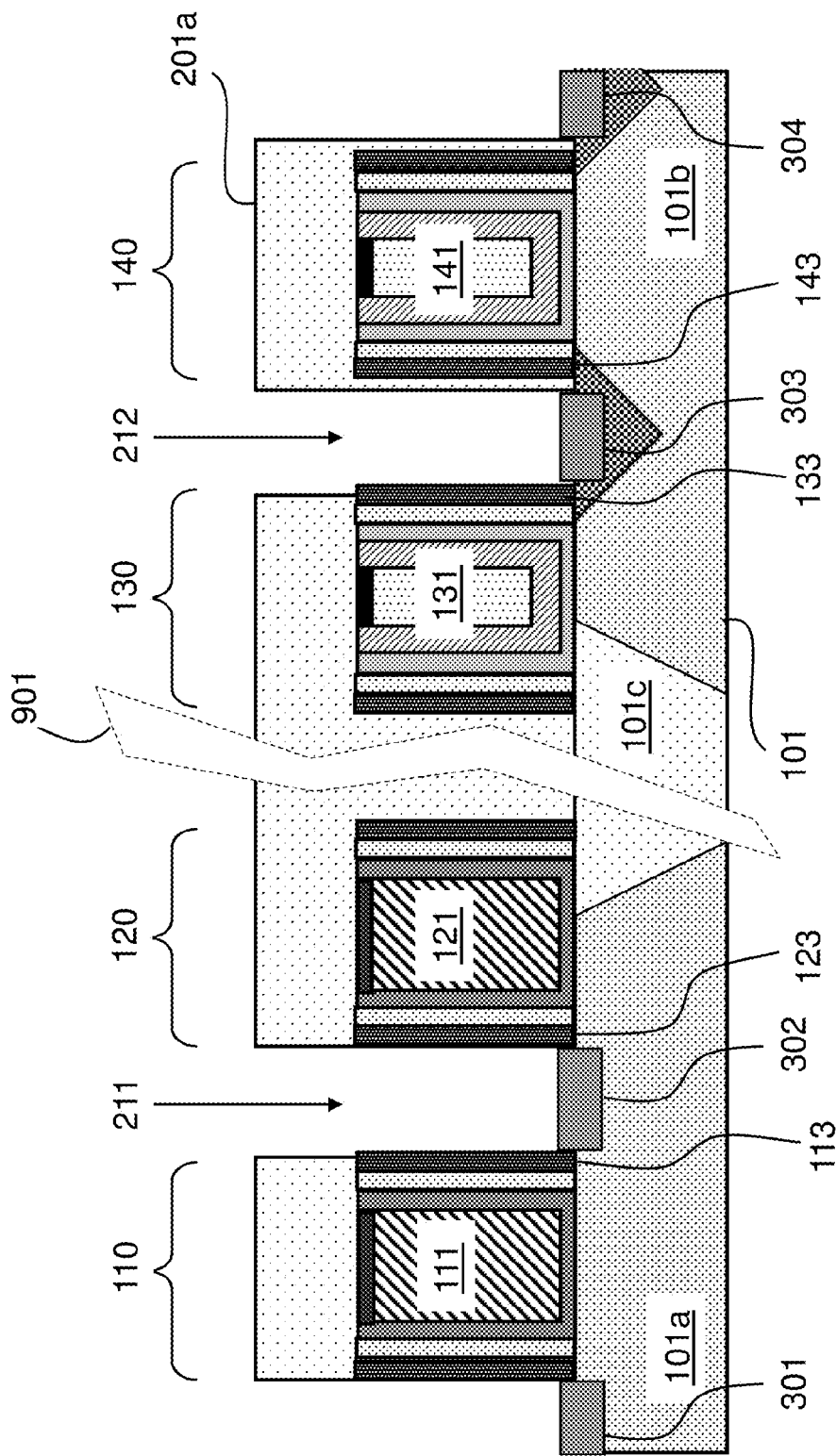
FIG. 2 is a demonstrative illustration of a step of a method of forming air-gap spacers in contact areas of transistors, after the step in FIG. 1, according to one embodiment of present invention.

FIG. 2 is a demonstrative illustration of a step of a method of forming air-gap spacers in contact areas of transistors, after the step in FIG. 1, according to one embodiment of present invention. For example, in one embodiment, the method may include creating openings inside dielectric layer 201 to expose underneath source/drain regions of transistors 110, 120, 130, and/or 140. In one embodiment, the openings may be, for example, trench openings and may be made such that they are self-aligned to the spacers at sidewalls of one or more of gate structures 110, 120, 130, and 140. For example, opening 211 between transistors 110 and 120 may be made self-aligned such that spacers 113 and 123 of transistors 110 and 120 may be fully exposed. In another embodiment, the openings may be, for example, trench openings and may be made such that they are surrounded or partially surrounded by dielectric layer 201 and so are not self-aligned to the spacers. For example, in FIG. 2, opening 212 may be self-aligned to gate structure 131 in that it fully exposes spacer 133 next to the sidewall of gate structure 131. In the meantime, opening 212 may not be self-aligned to gate structure 141 and may be separated from spacer 143 by some remaining dielectric material of dielectric layer 201. The creation of openings 211 and 212 inside dielectric layer 201 may be made through any known photolithographic patterning and etching process and may transform dielectric layer 201 into a mask layer 201a.

According to one embodiment of present invention, following the exposure of source/drain regions of transistors 110, 120, 130, and 140, silicide may preferably be formed at the top surface of the exposed source/drain regions to reduce contact resistance at the interface between source/drain and contacts to be formed thereupon. For example, trench silicide 301 and 302 may be formed at a first and a second side of gate structure 111 with trench silicide 302 being between gate structures 111 and 121; and trench silicide 303 and 304 may be formed at a first and a second side of gate structure 141 with trench silicide 303 being between gate structures 131 and 141. In forming trench silicide 301, 302, 303, and 304, one embodiment of present invention may include, for example, depositing in the openings such as openings 211 and 212 and on top of other exposed source/drain regions of substrate 101 a layer of suitable metal material that is predetermined or desired to form the silicide; subsequently subjecting the metal layer to an environment of suitable temperature to cause reaction of the metal material with underneath silicon thereby forming silicide 301, 302, 303, and 304. Depending upon the metal material used and so the types of silicide formed, the resulting silicide may expand or shrink in volume creating a top surface that may be slightly different from a top surface of substrate 101.

Figure 3:
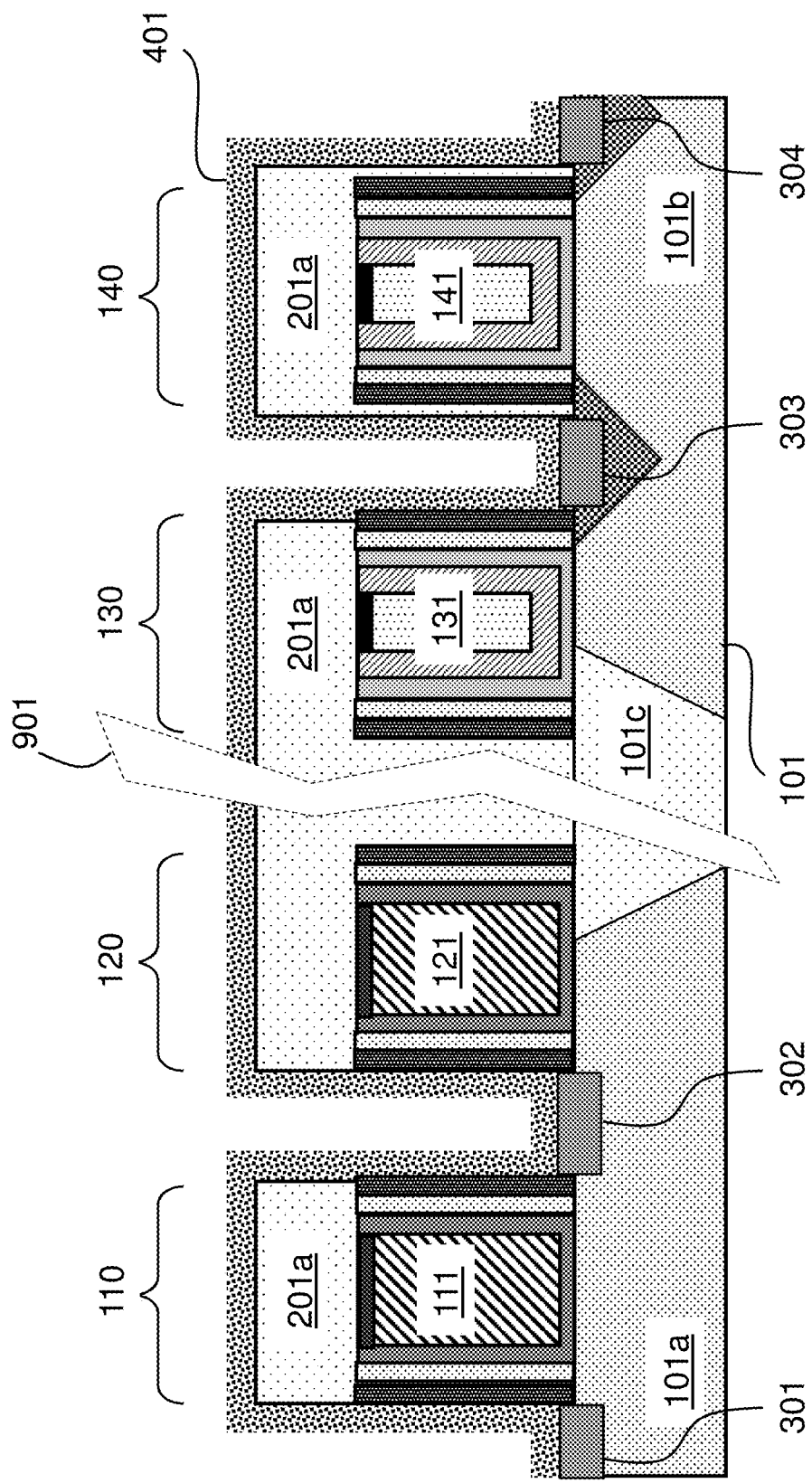
FIG. 3 is a demonstrative illustration of a step of a method of forming air-gap spacers in contact areas of transistors, after the step in FIG. 2, according to one embodiment of present invention.

FIG. 3 is a demonstrative illustration of a step of a method of forming air-gap spacers in contact areas of transistors, after the step in FIG. 2, according to one embodiment of present invention. More specifically, after forming trench silicide in the source/drain region, embodiments of present invention may include depositing a carbon layer 401 on top of and covering the structure that is formed so far on top of substrate 101. More specifically, the deposition may be performed in a low temperature environment such that the carbon layer 401 may be preferably formed conformally along sidewall of the trenches as well as on top of the silicide source/drain regions. In one embodiment, the conformal carbon layer 401 may be formed to leave a sufficient space, in the trench openings between transistor structures, such that metal contact may be formed therein. In another embodiment, carbon layer 401 may not necessarily be formed to be conformal but may be formed to have sufficient thickness along sidewalls of transistor structures 110, 120, 130, and 140 in order to form sidewall spacers.

TABLE 1

| Parameters | Properties |
|---|---|
| Deposition Temperature | 400 degree C. |
| Uniformity | 2% (1 s) |
| RI (refractive index) @ 633 nm | 1.97 |
| Extinction Coefficient @ 633 nm | 0.15 |
| Dielectric Constant k | 2~5 |
| Step Coverage | |
| Open/isolated region | ~100% |
| Dense region | ~100% |
| Sidewall Micro-loading | ~0% |
| Density (g/cc) | 1.49 |
| Stress | <50 MPa (Tensile) |
| E/H | 2.5/27 GPa |

According to one demonstrative embodiment of present invention, conformal carbon layer 401 may be formed to have properties as summarized above in Table 1. More specifically, carbon layer 401 may be deposited in a temperature around, for example, 400 degree C., resulting in the formed carbon layer 401 to have properties including, for example, uniformity around 2%, refractive index (RI) around 1.97, extinction coefficient around 0.15, dielectric constant k ranging 2~5, density around 1.49 g/cc, a tensile stress less than 50 MPa, and an E/H ratio around 2.5/2.7 GPa, as being listed in the above table 1. Moreover, the film may be deposited to have step coverage, both in the open/isolated region and in the dense region, of around 100%. Here, step coverage denotes a ratio of the film thickness over a step edge to the film thickness in a flat area. The deposited film may have a sidewall micro-loading around 0% which represents sidewall profile for different trench features.

Figure 4:
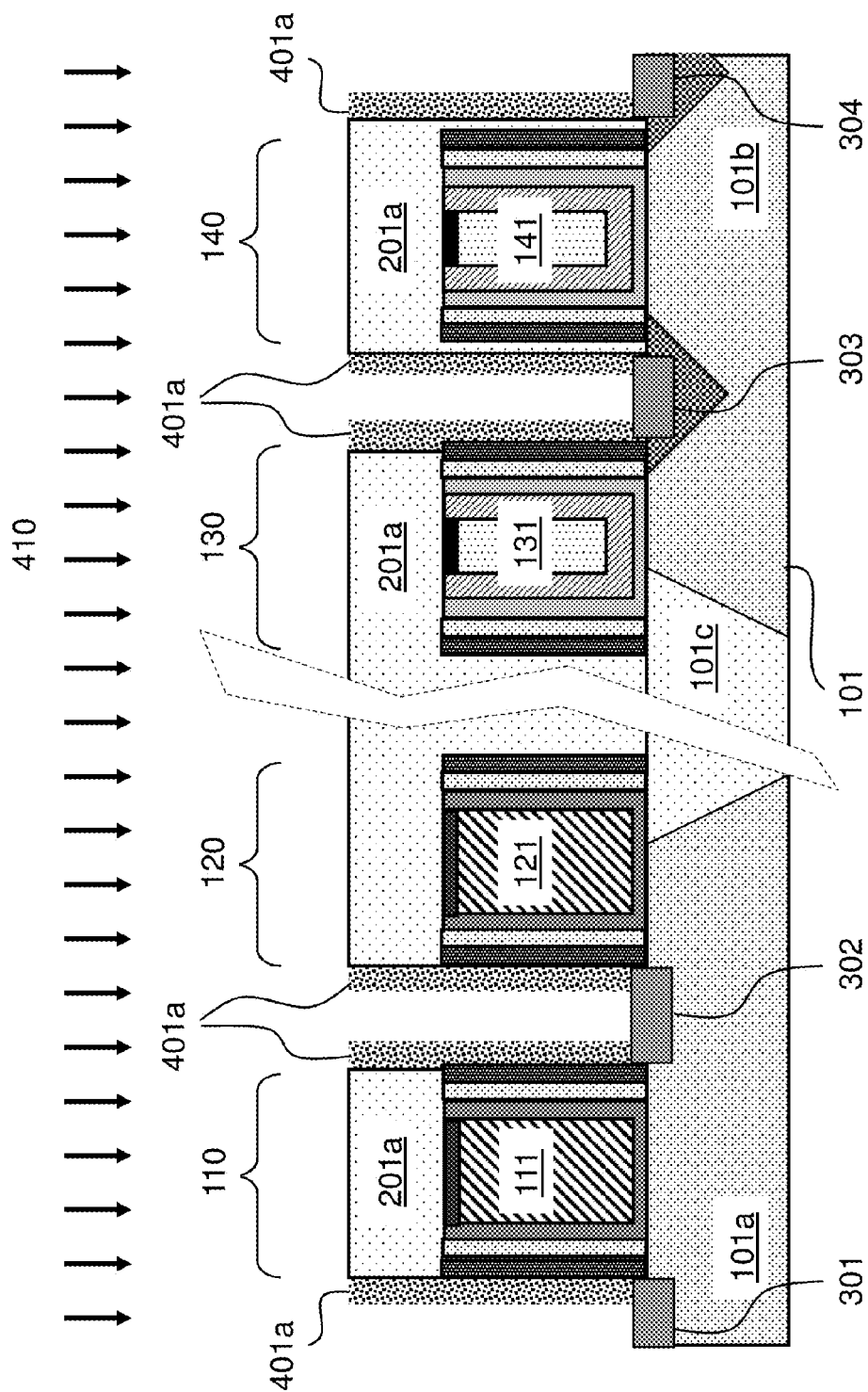
FIG. 4 is a demonstrative illustration of a step of a method of forming air-gap spacers in contact areas of transistors, after the step in FIG. 3, according to one embodiment of present invention.

FIG. 4 is a demonstrative illustration of a step of a method of forming air-gap spacers in contact areas of transistors, after the step in FIG. 3, according to one embodiment of present invention. More specifically, after the formation of carbon layer 401 which may be conformal or non-conformal, preferably conformal, embodiment of present invention may include transforming carbon layer 401 into carbon spacers 401a. In accomplishing this, a directional selective etching process 410 may be applied, for example, in a direction from the top of the transistors towards substrate 101, to remove portions of carbon layer 401 that are on top of silicide 301, 302, 303, and 304. The directional etching process may also remove portions of carbon layer 401 that are on top of mask layer 201a, along the horizontal direction, leaving only portions of carbon layer 401 that are adjacent to sidewalls of openings 211 and 212 in a vertical direction to become spacers 401a that are carbon based disposable spacers. As being demonstratively illustrated in FIG. 4, some of the disposable spacers 401a may be directly next to spacers, such as spacers 113 and 123 of transistors 110 and 120, and some may be next to remaining dielectric material of dielectric layer 201 such as that surrounding transistor 140.

Figure 5:
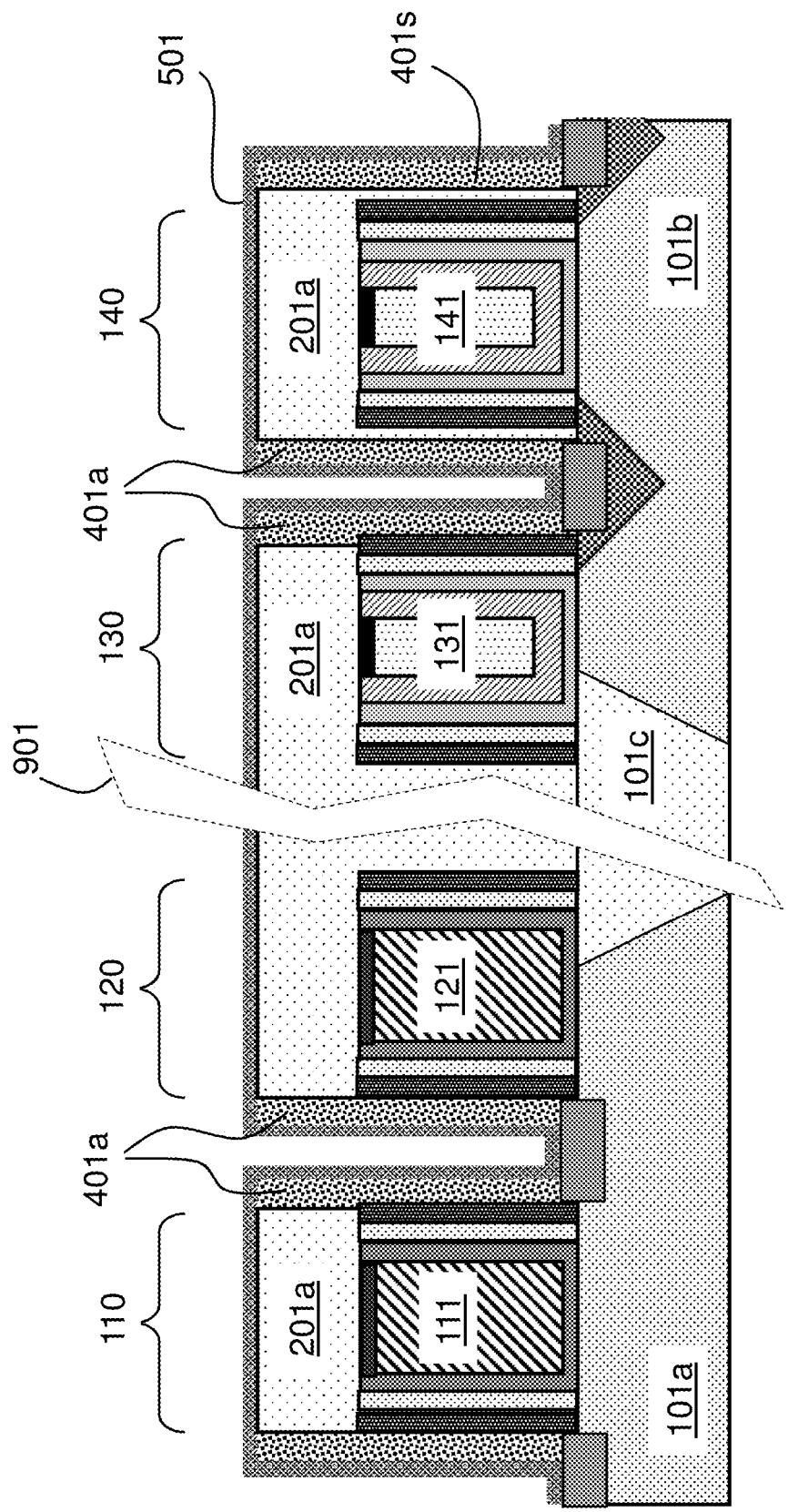
FIG. 5 is a demonstrative illustration of a step of a method of forming air-gap spacers in contact areas of transistors, after the step in FIG. 4, according to one embodiment of present invention.

FIG. 5 is a demonstrative illustration of a step of a method of forming air-gap spacers in contact areas of transistors, after the step in FIG. 4, according to one embodiment of present invention. More specifically, a layer of suitable lining material 501 may be optionally and preferably deposited around remaining spaces in openings 211 and 212 on top of silicide 301, 302, 303, 304 and next to the formed disposable carbon spacers 401a. The lining material may be, for example, titanium nitride although other material may be used as well, and may be deposited through a chemical vapor deposition (CVD) process, a sputter deposition process, or any other existing or future developed method or technique. The deposited liner 501 may be conductive, in direct contact with and covering silicide 301, 302, 303, and 304 in the source/drain regions of transistors 110, 120, 130, and 140. Liner 501 may provide improved contact of later formed contact stud to underneath silicide to help improve conductivity to the source/drain of transistors. In the meantime, liner 501 may function as a barrier layer as well to prevent material of contact stud, such as tungsten (W), from penetrating or getting into underneath source/drain regions of the transistors.

Figure 6:
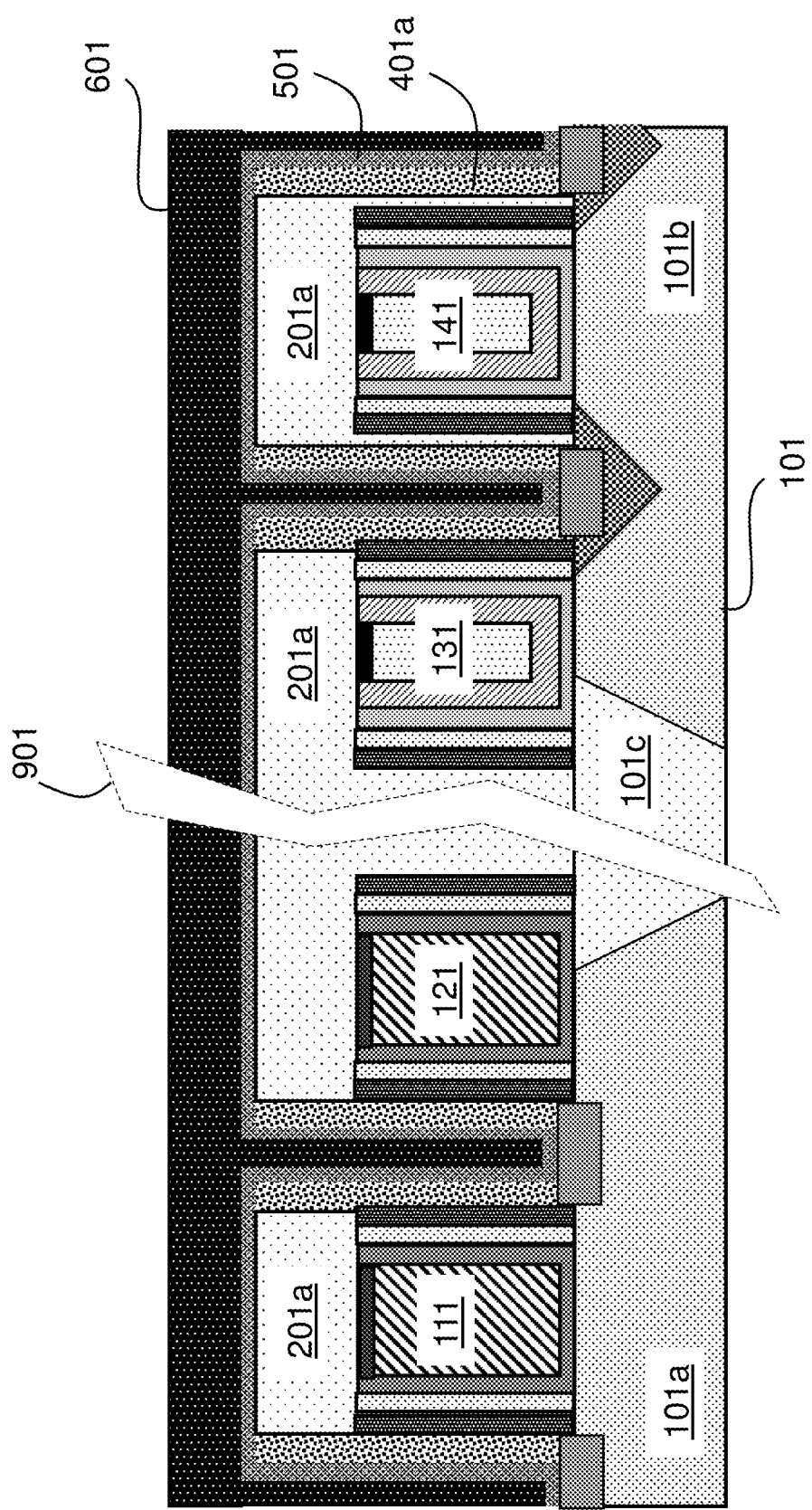
FIG. 6 is a demonstrative illustration of a step of a method of forming air-gap spacers in contact areas of transistors, after the step in FIG. 5, according to one embodiment of present invention.

FIG. 6 is a demonstrative illustration of a step of a method of forming air-gap spacers in contact areas of transistors, after the step in FIG. 5, according to one embodiment of present invention. More specifically, after contact openings 211 and 212 have been properly lined with lining material 501, conductive material 601, which may be tungsten (W), copper (Cu), aluminum (Al), or other suitable material, may be deposited into openings 211 and 212. The deposition may also result in conductive material 601 on top surface of liner 501. Conductive material 601 may form conductive studs, inside openings 211 and 212, to be in contact with source/drain of transistors 110, 120, 130, and 140. More specifically, contact studs made of conductive material 601 may be in contact with source/drain of the transistors 110, 120, 130, and 140 through silicide 301, 302, 303, and 304.

Figure 7:
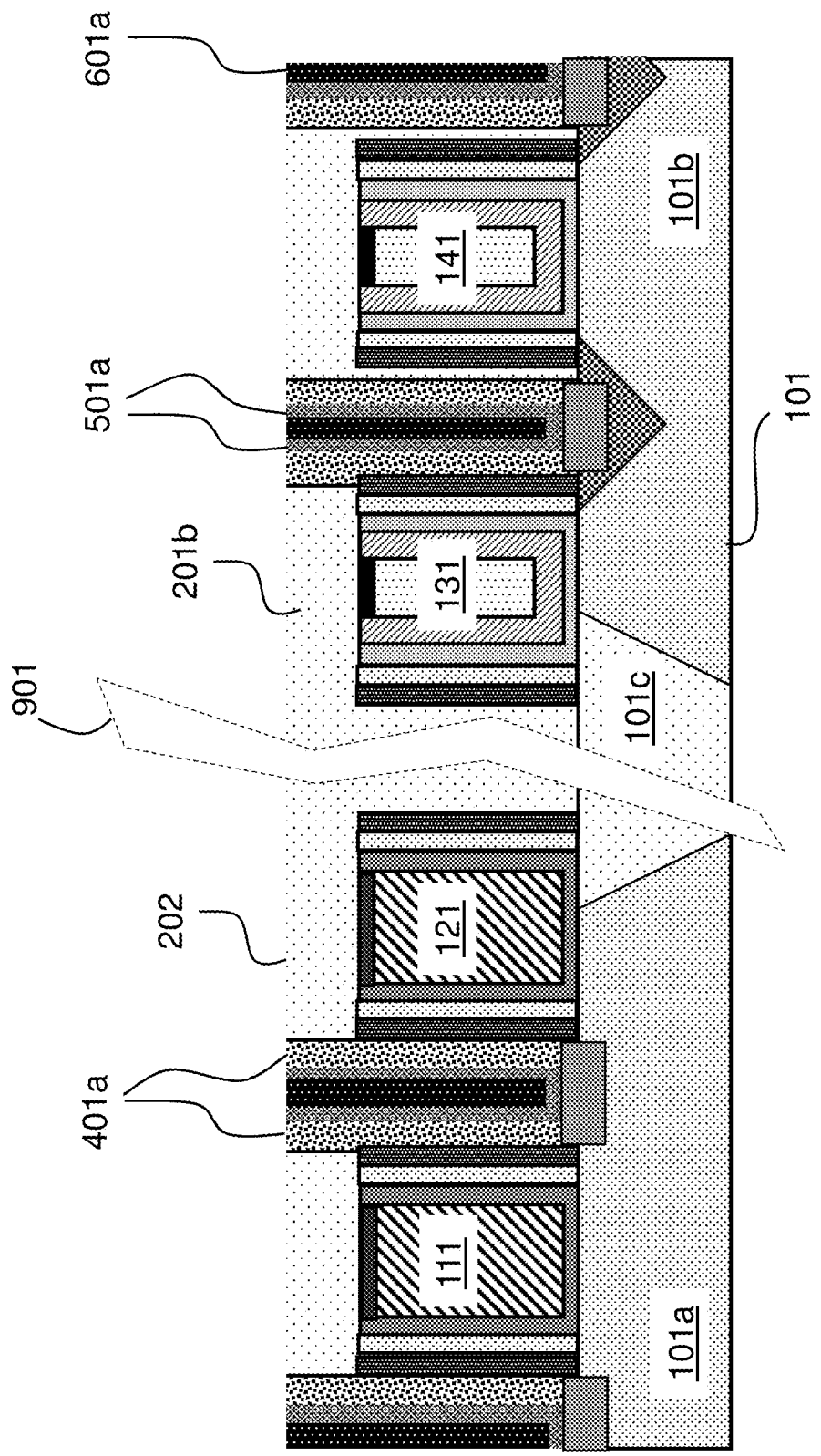
FIG. 7 is a demonstrative illustration of a step of a method of forming air-gap spacers in contact areas of transistors, after the step in FIG. 6, according to one embodiment of present invention.

FIG. 7 is a demonstrative illustration of a step of a method of forming air-gap spacers in contact areas of transistors, after the step in FIG. 6, according to one embodiment of present invention. More specifically, after the deposition of conductive layer 601 into remaining openings of 211 and 212, the rest of conductive material 601, such as those that are on top of liner 501 may be removed through, for example, a chemical-mechanic-polishing (CMP) process. The CMP process may remove portions of liner 501 as well that are on top of mask layer 201a and thereby expose underneath mask layer 201a. During the CMP process, some of the dielectric material of mask layer 201a may potentially be removed as well, leaving the rest of dielectric material 201b covering transistors 110, 120, 130, and 140. The CMP process may create a co-planar top surface 202 among dielectric material 201b, disposable carbon spacers 401a, lining material 501a, and conductive stud 601a. In other words, disposable carbon spacers 401a are exposed by their horizontal cross-section at top surface 202.

Figure 8:
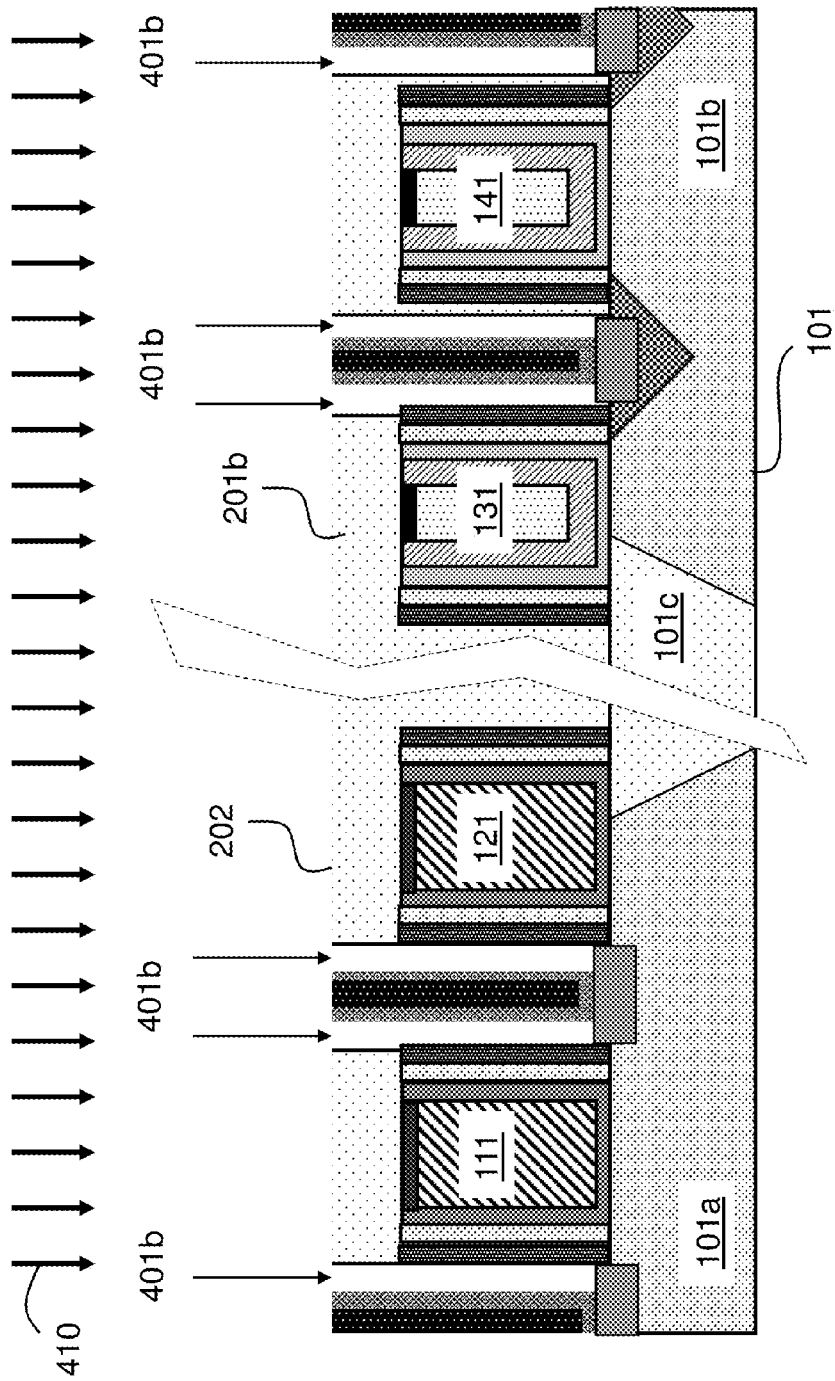
FIG. 8 is a demonstrative illustration of a step of a method of forming air-gap spacers in contact areas of transistors, after the step in FIG. 7, according to one embodiment of present invention.

FIG. 8 is a demonstrative illustration of a step of a method of forming air-gap spacers in contact areas of transistors, after the step in FIG. 7, according to one embodiment of present invention. More specifically, following the preceding CMP process that creates a co-planar top surface 202 and in the meantime exposes a horizontal cross section of the disposable carbon spacers 401a, one embodiment of present invention includes removing the disposable carbon spacers that are now sandwiched between liner 501a and sidewall spacers, such as spacers 113, 123, and 133 of transistors 110, 120, and 130 or between liner 501a and a vertical portion of dielectric material 201a such that inside opening 212 next to transistor 140. For example, one demonstrative exemplary approach of removing disposable carbon spacers 401a may be through an ash approach 410, which takes advantage of the particular properties of the carbon spacer material. In this ash process 410, an oxygen plasma environment may first be created by exposing oxygen gas at low pressure and in an environment with a temperature greater than 100 C. A RF discharge may then be applied to generate species through the oxygen plasma. The species may subsequently be caused to react with materials that are designed to be etched, such as carbon spacer material in the present invention. The reaction then forms a volatile product that is pumped away by a vacuum pump thereby removing the carbon spacers. Other currently existing or future developed methods may be used to remove/etch the carbon spacers as well.

Figure 9:
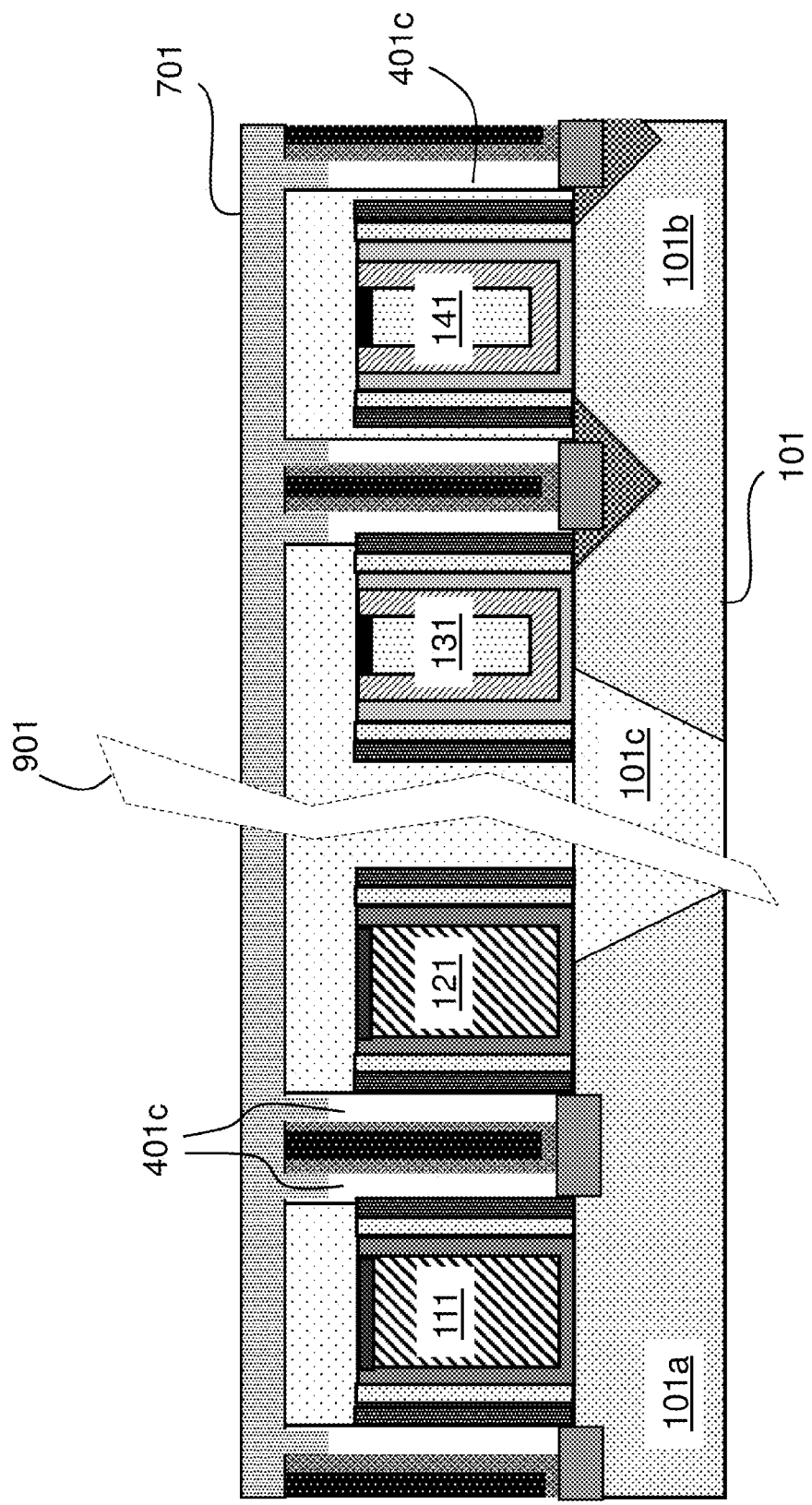
FIG. 9 is a demonstrative illustration of a step of a method of forming air-gap spacers in contact areas of transistors, after the step in FIG. 8, according to one embodiment of present invention.

FIG. 9 is a demonstrative illustration of a step of a method of forming air-gap spacers in contact areas of transistors, after the step in FIG. 8, according to one embodiment of present invention. Once the disposable carbon spacers are removed and openings 401b are created between conductive studs 601a and sidewalls of gate structures of transistors 110, 120, 130, and 140, one embodiment of present invention may include sealing the openings 401b created in the area of disposable carbon spacers to preserve the empty space underneath that has a dielectric constant of air, approximately 1, that is lower than the disposable carbon spacers (ranging 2~5) as well as most of other dielectric materials. The low dielectric constant of air helps reduce parasite capacitance that may potentially form between gate of the transistors and their source/drain contacts such as contact studs 601a.

More specifically, in sealing the air spaces in openings 401b, a layer of dielectric material 701 may be deposited onto exposed top surfaces of dielectric material 201b, liner 501a, conductive studs 601a, and openings of air spacers 401b. The deposition process may be controlled and/or otherwise conditioned such that only a small fraction of the dielectric material 701 may get into the top region of openings 401b, leaving the bottom region continue to be occupied by air forming air spacers 401c. In one embodiment, the dielectric material 701 may be nitride and the portion that is deposited into the spaces may be controlled to be less than, for example, about 2~3 nm.

Figure 10:
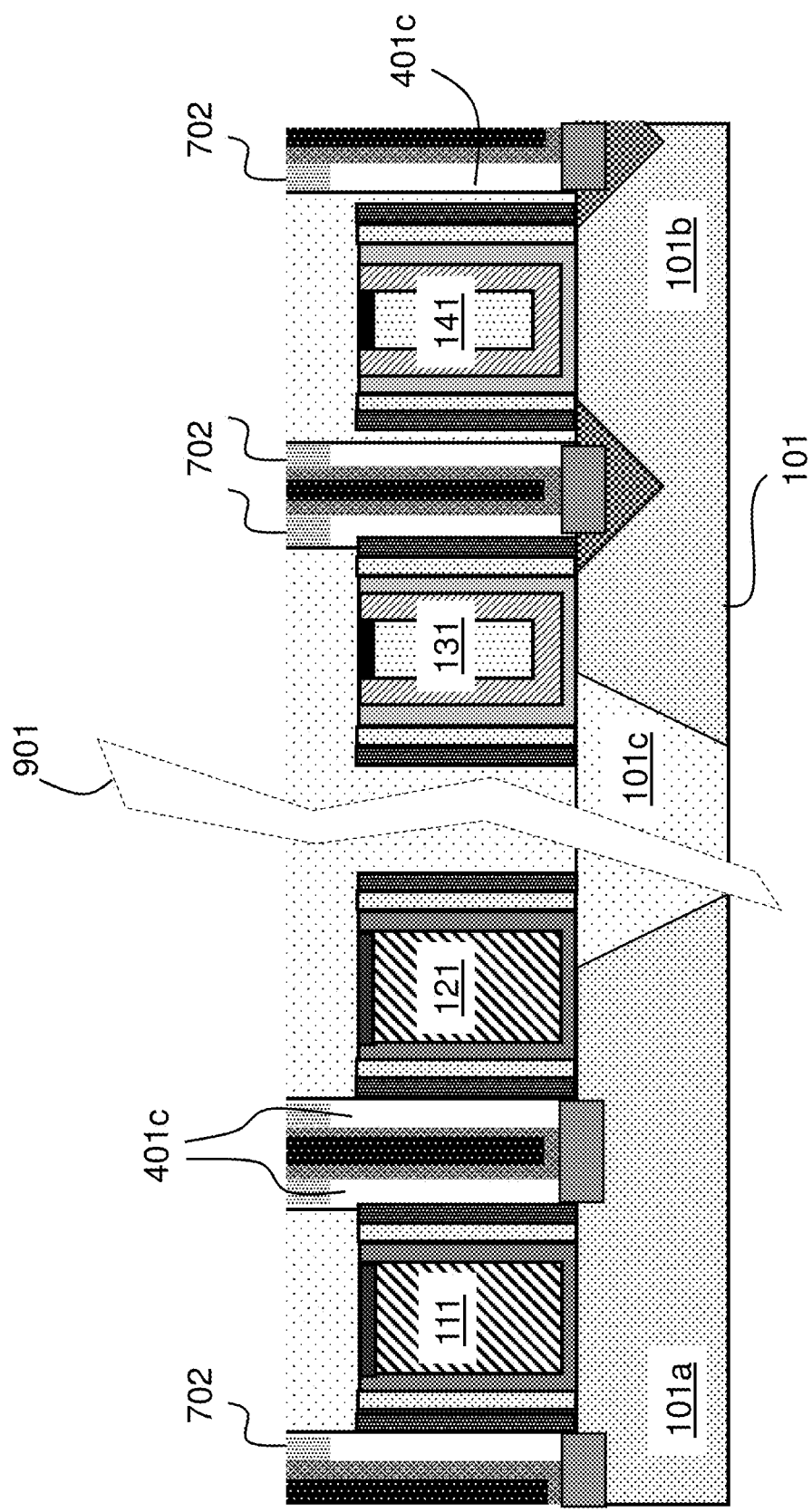
FIG. 10 is a demonstrative illustration of a step of a method of forming air-gap spacers in contact areas of transistors, after the step in FIG. 9, according to one embodiment of present invention.

Once the air spacers 401c are sealed properly thus majority of air spaces in the previous carbon spacer occupied areas are preserved, any extra dielectric material 701, in particular any material 701 that are deposited on top of dielectric material 201b, may be removed as being demonstratively illustrated in FIG. 10 such as, for example, through a CMP process. The CMP process may thus create dielectric plugs 702 on top of the air spacers 401c.

Figure 11:
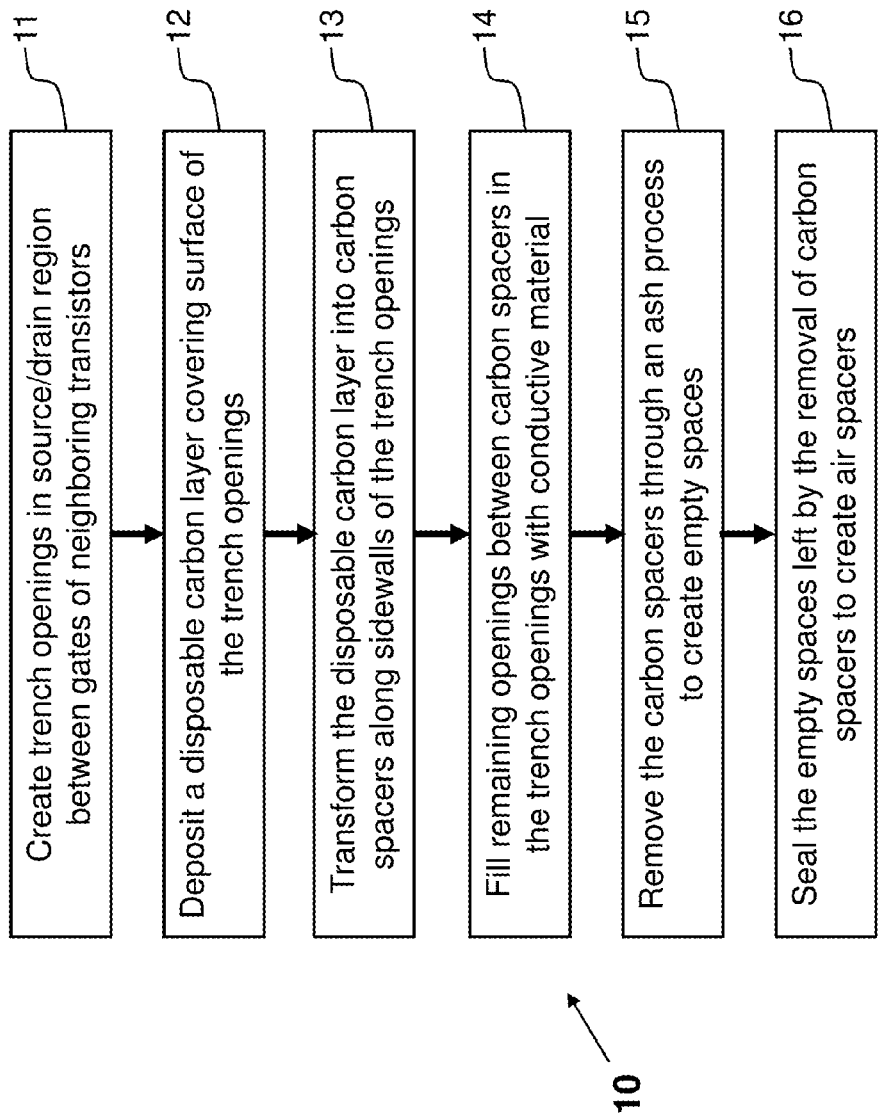
FIG. 11 is a simplified flow chart illustration of a method of forming air-gap spacers in contact areas of transistors according to another embodiment of present invention.

FIG. 11 is a simplified flow chart illustration of a method of forming air-gap spacers in contact areas of transistors according to another embodiment of present invention. More specifically, the method may include creating openings, which may be via openings or trench openings, in source/drain regions between gates of neighboring transistors at illustrated in step 11. The openings may be made to expose the source/drain of the transistors such that contacts to the source/drain may be formed later. Preferably, silicide may be formed at this stage to the exposed source/drain of the transistors. Next at step 12, a disposable layer of spacer-making material may be deposited to cover surface of the trench openings. For example, according to one embodiment of present invention, the material of disposable layer may be carbon material such that it may be removed after being formed into spacers, at a later stage, through an ash process. The deposited disposable carbon layer may subsequently be processed or transformed into spacers and the spacers may be adjacent to sidewalls of the trench openings at in step 13. After forming carbon spacers, there are still spaces remaining between opposing carbon spacers in a trench opening. The spaces may then be filled with suitable conductive material to form contacts to the source/drain of the transistors. Before forming the contacts, a liner or barrier layer may first be deposited in the remaining openings on top of the source/drain silicide. The spaces may then be filled up with suitable conductible materials as in step 14. The conductive material may include, for example, tungsten (W), copper (Cu), aluminum (Al), and/or other conductive material. The filling of conductive material in the remaining openings between carbon spacers may be performed using, as a non-limiting example, a chemical vapor deposition (CVD) process. Following the filling of conductive material in the openings, carbon spacers adjacent to sidewalls of the gates of transistors may be removed and/or replaced with empty spaces as in step 15. In other words, empty spaces were created in places where they were previously occupied by the carbon spacers. The removal of carbon spacers may be performed through, for example, an ash process. The ash process subjects the device structure, in particular the carbon spacers, to a temperature of as high as 250 C-300 C. The carbon spacers may then react with the species, which is created through an oxygen plasma, to form a volatile product which is then pump away from the spacer area by a vacuum pump. Following the creation of empty spaces between contacts formed in the openings and sidewalls of gates of the transistors, as being illustrated in step 16, embodiment of present invention includes a step of sealing the empty spaces with, for example, a dielectric material to form air spacers.

Figure 12:
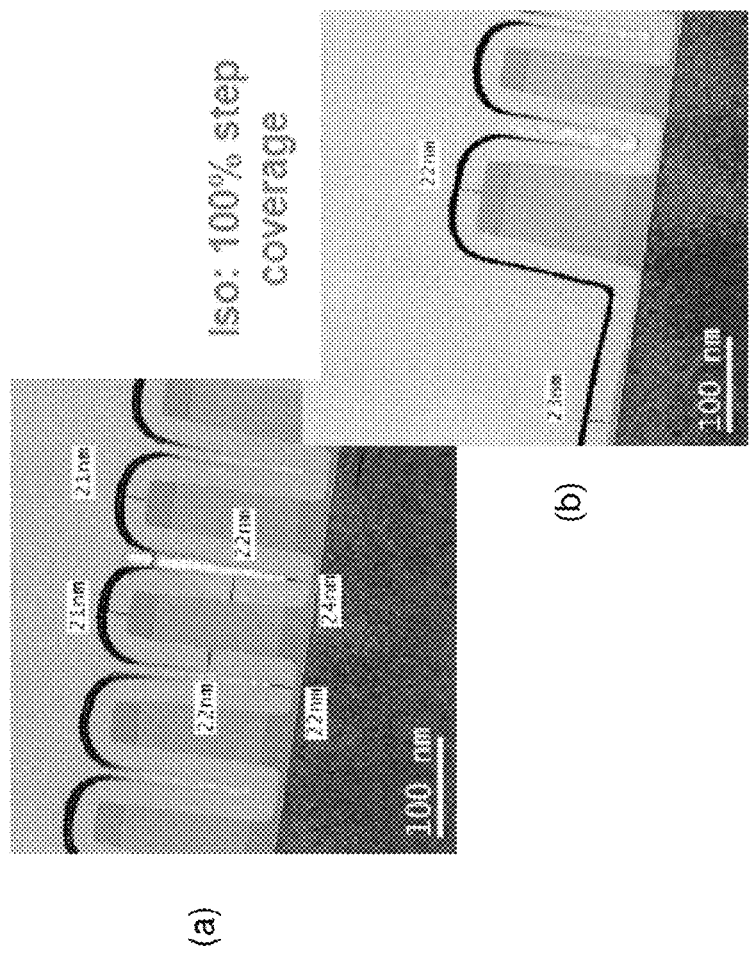
FIG. 12 presents some demonstrative SEM pictures illustrating the formation of disposable carbon spacers, next to sidewalls of transistors, that are formed according to one embodiment of present invention.

FIG. 12 are some demonstrative SEM pictures illustrating the formation of disposable carbon spacers, next to sidewalls of gate of transistors, which are formed according to one embodiment of present invention. The SEM pictures show close to 100% step coverage both in the dense area (a) and in isolated/open area (b) of the carbon layer formed, illustrating a very conformal disposable carbon layer formation.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
   providing a semiconductor substrate;
   forming a first and a second gate structure of a first and a second transistor on the substrate;
   forming a first and a second disposable spacer adjacent to sidewalls of said first and second gate structures respectively, said first and second disposable spacers facing each other and being between said first and second gate structures,
      wherein said first and second gate structures each comprise a gate and at least one sidewall spacer, and wherein said disposable spacers are formed next to said at least one sidewall spacer of said first and second gate structures;
   forming a conductive stud between said first and second disposable spacers, said conductive stud contacting a source/drain region of said first and second transistors;
   creating a first empty space between said conductive stud and said first gate structure and a second empty space between said conductive stud and said second gate structure, said first and second empty spaces being created next to said respective at least one sidewall spacer of said first and second gate structures,
      wherein said creating of said first empty space includes removing said first disposable spacer from between said conductive stud and said first gate structure without removing any additional material therebetween, and said creating of said second empty space includes removing said second disposable spacer from between said conductive stud and said second gate structure without removing and additional material therebetween; and
   sealing said first and second empty spaces to form a first and a second air spacer between said conductive stud and said first and second gate structures of said first and second transistors.

2. The method of claim 1, wherein forming said first and second disposable spacers comprises depositing a carbon layer covering said first and second gate structures of said first and second transistors, and subsequently applying a directional etching process and removing portions of said carbon layer, leaving only a portion adjacent to said sidewalls of said first and second gate structures to form said disposable spacers.

3. The method of claim 2, wherein creating said first and second empty spaces comprises applying an ash process to remove said first and second disposable spacers, thereby creating said empty spaces in places that were previously occupied by said disposable spacers.

4. The method of claim 3, wherein removing said first and second disposable spacers by said ash process comprises:
   exposing said first and second disposable spacers at a horizontal cross-section thereof, and
   removing said first and second disposable spacers through said horizontal cross-section in an oxygen plasma environment.

5. The method of claim 3, wherein sealing said first and second empty spaces comprises depositing a layer of dielectric material covering said first and second empty spaces, wherein condition of depositing said layer of dielectric material being adjusted such that said layer of dielectric material does not substantially get into said first and second empty spaces.

6. The method of claim 5, wherein depositing said layer of dielectric material comprises causing said layer of dielectric material to get into said empty spaces, from a top thereof, in a depth less than about 3 nm.

7. The method of claim 1, further comprising depositing a liner lining said disposable spacers and said source/drain region before forming said conductive stud, wherein said source/drain region having a silicide on top thereof.

8. The method of claim 1, wherein said creating of said first empty space comprises creating said first empty space such that said first empty space is self-aligned to said at least one sidewall spacer of said first gate structure, and
   wherein said creating of said second empty space comprises creating said second empty space such that said second empty space is self-aligned to said at least one sidewall spacer of said second gate structure.

9. The method of claim 1, wherein said creating of said first empty space comprises creating said first empty space such that said first empty space is not self-aligned to said at least one sidewall spacer of said first gate structure. and
   wherein said creating of said second empty space comprises creating said second empty space such that said second empty space is not self-aligned to said at least one sidewall spacer of said second gate structure.

10. The method of claim 7, wherein said creating of said first empty space comprises removing said disposable spacer from between said at least one sidewall spacer of said first gate structure and said liner, and
  wherein said creating of said second empty space comprises removing said disposable spacer from between said at least one sidewall spacer of said second gate structure and said liner.

11. A method comprising:
  forming a transistor having a gate structure on top of a semiconductor substrate;
  forming at least one disposable spacer adjacent to a sidewall of said gate structure,
    wherein said gate structure comprises a gate and at least one sidewall spacer, and
    wherein said at least one disposable spacer is formed next to said at least one sidewall spacer of said gate structure;
  forming at least one conductive stud next to said disposable spacer, said conductive stud being on top of and contacting a source/drain region of said transistor;
  removing said disposable spacer to create an empty space between said conductive stud and said gate structure without removing and additional material therebetween, said empty space being created next to said sidewall spacer of said gate structure without removing any additional material therebetween; and
  sealing said empty space to form an air spacer between said conductive stud and said gate structure of said transistor.

12. The method of claim 11, wherein forming said disposable spacer comprises depositing a carbon layer covering said gate structure of said transistor, and subsequently applying a directional etching process in removing horizontal portions of said carbon layer, leaving only a vertical portion of said carbon layer, that is adjacent to said sidewall of said gate structure, to form said disposable spacer.

13. The method of claim 11, wherein removing said disposable spacer comprises:
  subjecting said disposable spacer to an oxygen plasma environment;
  causing said disposable spacer to react with one or more species of said oxygen plasma to form a volatile product; and
  pumping said volatile product away from said gate structure of said transistor.

14. The method of claim 11, wherein sealing said empty space comprises depositing a layer of dielectric material to fill in said empty space in a depth less than a height of said empty space.

15. The method of claim 11, further comprising depositing a liner lining said disposable spacer and said source/drain region before forming said conductive stud, wherein said source/drain region having a silicide on top thereof.

16. A method comprising:
  forming a gate structure of a transistor on top of a semiconductor substrate;
  forming a first and a second disposable spacers adjacent respectively to a first and a second sidewall of said gate structure,
    wherein said gate structure comprises a gate and a first and a second sidewall spacer, and wherein said first and second disposable spacers are respectively formed next to said first and second sidewall spacers of said gate structure;
  forming a first and a second conductive studs next respectively to said first and said second disposable spacer;
  removing said first and second disposable spacers to create empty spaces between said first and second conductive studs and said gate structure without removing any additional material therebetween, said empty spaces being created next to said first and second sidewall spacers of said gate structure; and
  preserving said empty spaces by forming dielectric plugs at a top of said empty spaces.

17. The method of claim 16, wherein forming said first and second disposable spacers comprises depositing a substantially conformal carbon layer covering said gate structure of said transistor, and subsequently applying a directional etching process in removing horizontal portions of said carbon layer, leaving only vertical portions of said carbon layer, that are adjacent to said first and second sidewalls of said gate structure, to form said first and second disposable spacers.

18. The method of claim 16, wherein removing said first and second disposable spacers comprises:
  causing said first and second disposable spacers to react with one or more species of an oxygen plasma to form a volatile product; and
  pumping said volatile product away from said gate structure of said transistor.

19. The method of claim 16, wherein forming said dielectric plugs comprises depositing a layer of dielectric material to fill in said empty spaces in a depth that is substantially less than a height of said empty spaces, wherein said height of said empty spaces is a height of said disposable spacers.

20. The method of claim 16, further comprising, before forming said first and said second disposable spacers, forming silicide at a top portion of source/drain regions that are next to sidewalls of said gate structure of said transistor, and depositing a barrier layer on top of and covering said silicide.

* * * * *